US010844157B2

(12) United States Patent
Harada

(10) Patent No.: US 10,844,157 B2
(45) Date of Patent: Nov. 24, 2020

(54) POLYISOCYANATE CURED PRODUCT, AND METHOD FOR PRODUCING POLYISOCYANATE CURED PRODUCT

(71) Applicant: ASAHI KASEI KABUSHIKI KAISHA, Tokyo (JP)

(72) Inventor: Yoshijiro Harada, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 143 days.

(21) Appl. No.: 15/306,573

(22) PCT Filed: Apr. 30, 2015

(86) PCT No.: PCT/JP2015/062975
§ 371 (c)(1),
(2) Date: Oct. 25, 2016

(87) PCT Pub. No.: WO2015/166983
PCT Pub. Date: Nov. 5, 2015

(65) Prior Publication Data
US 2017/0044296 A1    Feb. 16, 2017

(30) Foreign Application Priority Data

May 2, 2014  (JP) ................................ 2014-095296

(51) Int. Cl.
| C08G 18/02 | (2006.01) |
| C08G 18/28 | (2006.01) |
| C09D 175/04 | (2006.01) |
| C08G 18/73 | (2006.01) |
| C08G 18/72 | (2006.01) |
| C08G 18/79 | (2006.01) |
| H01L 23/29 | (2006.01) |
| C08L 79/04 | (2006.01) |
| H01L 23/31 | (2006.01) |
| C08G 18/09 | (2006.01) |
| C08G 18/75 | (2006.01) |
| C08G 18/78 | (2006.01) |
| C08G 18/62 | (2006.01) |
| C08K 5/00 | (2006.01) |
| C08G 18/18 | (2006.01) |
| C08G 18/22 | (2006.01) |
| H01L 33/56 | (2010.01) |
| H01L 33/60 | (2010.01) |

(52) U.S. Cl.
CPC .......... *C08G 18/022* (2013.01); *C08G 18/02* (2013.01); *C08G 18/09* (2013.01); *C08G 18/092* (2013.01); *C08G 18/18* (2013.01); *C08G 18/1875* (2013.01); *C08G 18/222* (2013.01); *C08G 18/282* (2013.01); *C08G 18/2825* (2013.01); *C08G 18/6225* (2013.01); *C08G 18/725* (2013.01); *C08G 18/73* (2013.01); *C08G 18/755* (2013.01); *C08G 18/7837* (2013.01); *C08G 18/792* (2013.01); *C08K 5/005* (2013.01); *C08L 79/04* (2013.01); *C09D 175/04* (2013.01); *H01L 23/29* (2013.01); *H01L 23/31* (2013.01); *H01L 33/56* (2013.01); *H01L 33/60* (2013.01); *H01L 2924/0002* (2013.01); *H01L 2933/005* (2013.01); *H01L 2933/0033* (2013.01); *H01L 2933/0058* (2013.01)

(58) Field of Classification Search
CPC .. C08G 18/022; C08G 18/725; C08G 18/282; C08G 18/792; C08G 18/7837; C08G 18/755; C08G 18/6225; C08G 18/2825; C08G 18/73; C08G 18/092; C08G 18/222; C08G 18/1875; C08G 18/02; C08G 18/09; C08G 18/18; C09D 175/04; H01L 23/29; H01L 23/31; H01L 2933/0058; H01L 2933/005; H01L 2933/0033; H01L 2924/0002; H01L 33/56; H01L 33/60; H01L 2924/00; C08K 3/00; C08K 5/00; C08L 79/04
See application file for complete search history.

(56) References Cited

U.S. PATENT DOCUMENTS

| 4,499,253 A * | 2/1985 | Kerimis | C08G 18/791 521/107 |
| 5,290,902 A * | 3/1994 | Jacobs | C07D 251/34 252/182.21 |
| 5,767,220 A * | 6/1998 | Venham | C08G 18/671 252/182.18 |
| 6,133,397 A * | 10/2000 | O'Connor | C08G 18/022 528/44 |
| 7,834,103 B2 * | 11/2010 | Asahina | C08G 18/092 525/453 |

(Continued)

FOREIGN PATENT DOCUMENTS

| CN | 1519921 A | 8/2004 |
| CN | 1690811 A | 11/2005 |

(Continued)

OTHER PUBLICATIONS

International Search Report issued with respect to Application No. PCT/JP2015/062975, dated Aug. 11, 2015.

(Continued)

*Primary Examiner* — Rabon A Sergent
(74) *Attorney, Agent, or Firm* — Greenblum & Bernstein, P.L.C.

(57) ABSTRACT

The polyisocyanate cured product according to the present invention has an isocyanurate structure, which comprises at least one diisocyanate selected from the group consisting of an aliphatic diisocyanate and an alicyclic diisocyanate, as a unit structure, the polyisocyanate cured product having an allophanate group, and the molar ratio of the isocyanurate group to the allophanate group (isocyanurate group/allophanate group) is 99/1 to 20/80.

9 Claims, No Drawings

(56) References Cited

U.S. PATENT DOCUMENTS

| | | | |
|---|---|---|---|
| 8,952,120 B2 * | 2/2015 | Asahina | C08G 18/0852 252/182.2 |
| 9,666,330 B2 * | 5/2017 | Takei | C08G 18/6576 |
| 2004/0157992 A1 | 8/2004 | Uwada et al. | |
| 2005/0237765 A1 | 10/2005 | Suehiro et al. | |
| 2006/0089464 A1 | 4/2006 | Uwada et al. | |
| 2009/0131603 A1 | 5/2009 | Asahina et al. | |
| 2018/0079855 A1 * | 3/2018 | Matner | C08G 18/792 |

FOREIGN PATENT DOCUMENTS

| | | |
|---|---|---|
| CN | 101291970 A | 10/2008 |
| CN | 102015815 A | 4/2011 |
| CN | 105829375 A | 8/2016 |
| JP | S59-059716 A | 4/1984 |
| JP | S59-098180 A | 6/1984 |
| JP | S59-120615 A | 7/1984 |
| JP | 2004-238441 A | 8/2004 |
| JP | 2005-310562 A | 11/2005 |
| JP | 2006-117844 A | 5/2006 |
| JP | 2011-148850 A | 8/2011 |
| JP | 2012-021129 A | 2/2012 |
| JP | 2012-041513 A | 3/2012 |
| WO | WO 2007/034883 A1 * | 3/2007 |
| WO | 2007-046470 A | 4/2007 |
| WO | WO 2013/054659 A1 * | 4/2013 |

OTHER PUBLICATIONS

International Preliminary Report on Patentability issued with respect to Application No. PCT/JP2015/062975, dated Nov. 8, 2016.

* cited by examiner

POLYISOCYANATE CURED PRODUCT, AND METHOD FOR PRODUCING POLYISOCYANATE CURED PRODUCT

TECHNICAL FIELD

The present invention relates to a polyisocyanate cured product, and a method for producing a polyisocyanate cured product.

BACKGROUND ART

Cured products obtained by using, as a curing agent, a polyisocyanate composition derived from an aliphatic diisocyanate or an alicyclic diisocyanate exhibit excellent performance in terms of weatherability, chemical resistance, abrasion resistance, etc., and are thus widely used for a coating material, an ink, an adhesive, and the like. In this case, a polyol or a polyamine is typically used as a main agent, and the hydroxy group or amine group of the main agent reacts with the isocyanate group of the curing agent to form a compound having a urethane group or urea group. The compound having a urethane group or urea group thus formed has a decomposition temperature of approximately 150° C., and is not suitable for applications which require stability at high temperatures, such as sealing materials for optical semiconductor devices.

For a method for enhancing the thermal resistance of a cured product, a technique relating to a polyisocyanate cured product obtained by subjecting a diisocyanate as a starting material to isocyanuratization is disclosed (e.g., see Patent Literatures 1, 2, and 3).

CITATION LIST

Patent Literature

Patent Literature 1: Japanese Patent Laid-Open No. 2012-21129
Patent Literature 2: Japanese Patent Laid-Open No. 2012-41513
Patent Literature 3: Japanese Patent Laid-Open No. 59-98180

SUMMARY OF INVENTION

Technical Problem

In the methods described in Patent Literatures 1 to 3, the crosslinking point of the cured product consists only of a cyclic structure, and as a result, it causes the cured product to lack flexibility and the cured product may crack when being impacted, for example. When, in particular, the resin having a certain level of moisture is subjected to a high temperature, swelling or cracking is likely to be caused. Accordingly, the cured products described in Patent Literatures 1 to 3 are insufficient for use as a sealing material for an optical semiconductor device, which is required to have thermal resistance in combination with moisture/reflow sensitivity.

In view of this, an object of the present invention is to provide a polyisocyanate cured product having thermal resistance and impact resistance, and further being excellent in moisture/reflow sensitivity, in combination with water vapor impermeability, which is an important physical property for a sealing material and reflector for an optical semiconductor device.

Solution to Problem

To solve the above problems, the present inventors made diligent study and have found that a polyisocyanate cured product produced by solvent-free polymerization of a polyisocyanate composition obtained from an aliphatic or alicyclic diisocyanate as a starting material and having less toxicity than diisocyanates, with preferably using a less amount of a catalyst, can solve the above problems.

Specifically, the present invention is as follows.

[1]
A polyisocyanate cured product comprising an isocyanurate structure, which comprises at least one diisocyanate selected from the group consisting of an aliphatic diisocyanate and an alicyclic diisocyanate, as a unit structure, the polyisocyanate cured product having an allophanate group, wherein a molar ratio of an isocyanurate group to the allophanate group (isocyanurate group/allophanate group) is 99/1 to 20/80.

[2]
The polyisocyanate cured product according to [1], wherein the molar ratio of the isocyanurate group to the allophanate group (isocyanurate group/allophanate group) is 99/1 to 50/50.

[3]
The polyisocyanate cured product according to [1] or [2], wherein a yellowness index (YI) in a case of 1 mm thickness is 10 or smaller, and a change in a yellowness index (YI) in a thermal yellowing resistance test under conditions of 150° C.×144 hours is 10 or smaller.

[4]
A method for producing a polyisocyanate cured product by using:
(a) a polyisocyanate composition comprising a polyisocyanate obtained from at least one diisocyanate selected from the group consisting of an aliphatic diisocyanate and an alicyclic diisocyanate and having an isocyanurate group, and a polyisocyanate obtained from at least one diisocyanate selected from the group consisting of an aliphatic diisocyanate and an alicyclic diisocyanate and having an allophanate group; and
(b) an isocyanuratization catalyst as starting materials,
wherein the method comprises a step of performing isocyanuratization reaction under a substantially solvent-free condition until a disappearance rate of an isocyanate group (NCO group) in the polyisocyanate composition reaches 90% or higher.

[5]
The method for producing the polyisocyanate cured product according to [4], wherein a molar ratio of the isocyanurate group to the allophanate group (isocyanurate group/allophanate group) in the polyisocyanates in the polyisocyanate composition is 99/1 to 30/70.

[6]
The method for producing the polyisocyanate cured product according to [5], wherein the polyisocyanate composition is a polyisocyanate composition obtained by using a monoalcohol having 3 to 9 carbon atoms as one of the starting materials.

[7]
The method for producing the polyisocyanate cured product according to any of [4] to [6], wherein an isocyanate group (NCO group) content of the polyisocyanates in the polyisocyanate composition is 7.0 to 23.0% by mass.

[8]
The method for producing the polyisocyanate cured product according to any of [4] to [7], wherein a number average functionality of the isocyanate group (NCO group) in the polyisocyanates in the polyisocyanate composition is 2.1 or more.

[9]

The method for producing the polyisocyanate cured product according to any of [4] to [8], wherein the (b) isocyanuratization catalyst comprises a quaternary organic ammonium salt.

[10]

The method for producing a polyisocyanate cured product according to any of [4] to [9], wherein an amount of the (b) isocyanuratization catalyst added is 5000 ppm or less based on a solid content of the polyisocyanate composition.

[11]

The method for producing the polyisocyanate cured product according to any of [4] to [10], wherein (c) an antioxidant is further used as a starting material.

[12]

The method for producing the polyisocyanate cured product according to [11], wherein the (c) antioxidant is at least one selected from the group consisting of a hindered phenol antioxidant, a hindered amine antioxidant, a sulfur-containing antioxidant and a phosphorus-containing antioxidant.

[13]

An optical semiconductor device comprising an optical semiconductor element sealed therein with the polyisocyanate cured product according to any of [1] to [3].

[14]

An optical semiconductor device comprising an optical semiconductor element sealed therein with a polyisocyanate cured product substantially free of a urethane group and a urea group.

[15]

An optical semiconductor device comprising, a polyisocyanate cured product substantially free of a urethane group and a urea group as a reflector, Advantageous Effects of Invention The polyisocyanate cured product according to the present invention has the features of having thermal resistance and impact resistance, and further having good moisture/reflow sensitivity, in combination with water vapor impermeability, which is an important physical property for a sealing material and reflector for an optical semiconductor device.

DESCRIPTION OF EMBODIMENTS

Hereinafter, each embodiment for carrying out the present invention (hereinafter, referred to as "the present embodiment") will be described in detail. It is to be noted that the present invention is never limited to the following embodiments of the present invention. The present invention may be carried out appropriately with a modification within the gist thereof.

<<Polyisocyanate Cured Product>>

A polyisocyanate cured product according to the present embodiment will be described in detail.

The polyisocyanate cured product according to the present embodiment has an isocyanurate structure, which has at least one diisocyanate selected from the group consisting of an aliphatic diisocyanate and an alicyclic diisocyanate, as a unit structure. The isocyanurate structure (hereinafter, also referred to as "an isocyanurate group") is represented by the following formula (1).

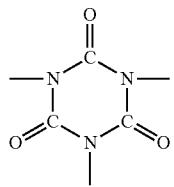

In the present embodiment, the aliphatic diisocyanate is a diisocyanate having a saturated aliphatic group in the molecule, and the alicyclic diisocyanate is a diisocyanate having an alicyclic group in the molecule. Use of the aliphatic diisocyanate is preferred because flexibility can be imparted to a polyisocyanate cured product to be obtained. Examples of the aliphatic diisocyanate include, but not limited to, 1,4-diisocyanatobutane, 1,5-diisocyanatopentane, 1,6-diisocyanatohexane (hereinafter, also abbreviated as "HDI"), 1,6-diisocyanato-2,2,4-trimethylhexane, and methyl 2,6-diisocyanatohexanoate (lysine diisocyanate). Examples of the alicyclic diisocyanate include, but not limited to, 5-isocyanato-1-isocyanatomethyl-1,3,3-trimethylcyclohexane (isophorone diisocyanate), 1,3-bis(isocyanatomethyl)cyclohexane (hydrogenated xylylene diisocyanate), bis(4-isocyanatocyclohexyl)methane (hydrogenated diphenylmethane diisocyanate), and 1,4-diisocyanatocyclohexane. Among them, HDI, isophorone diisocyanate, hydrogenated xylylene diisocyanate, and hydrogenated diphenylmethane diisocyanate are preferred because of industrial availability. Especially, HDI is more preferred because it provides very high balance between weatherability and the flexibility of a coating film. Hereinafter, the aliphatic diisocyanate and alicyclic diisocyanate are collectively referred to as the diisocyanate.

The polyisocyanate cured product according to the present embodiment has an allophanate group. In the polyisocyanate cured product according to the present embodiment, the molar ratio of the isocyanurate group to the allophanate group (isocyanurate group/allophanate group) is in the range of 99/1 to 20/80. The polyisocyanate cured product according to the present embodiment has sufficient flexibility if the molar ratio of the isocyanurate group to the allophanate group (isocyanurate group/allophanate group) is 99/1 or less, and has sufficient thermal resistance if the molar ratio of the isocyanurate group to the allophanate group is 20/80 or more. In the polyisocyanate cured product according to the present invention, the molar ratio of the isocyanurate group to the allophanate group (isocyanurate group/allophanate group) is preferably 99/1 to 50/50, more preferably 99/1 to 60/40, even more preferably 99/1 to 70/30, furthermore preferably 99/1 to 80/20, and particularly preferably 98/2 to 90/10, from the viewpoint of obtaining better thermal resistance. The molar ratio of the isocyanurate group to the allophanate group in the polyisocyanate cured product can be measured by using 13C-NMR for the polyisocyanate cured product after being frozen and crashed, and specifically can be measured by using a method to be described later in Examples.

The "polyisocyanate cured product" according to the present embodiment is substantially free of a urethane group and a urea group. Being substantially free of a urethane group and a urea group means that the molar ratio of the isocyanurate group to the total of the urethane group and the urea group (isocyanurate group/(urethane group+urea group)) falls in the range of 100/0 to 95/5. The polyisocyanate cured product according to the present embodiment can be provided with good thermal resistance if isocyanurate group/(urethane group+urea group) is in the range of 100/0 to 95/5. In the polyisocyanate cured product according to the present embodiment, isocyanurate group/(urethane group+ urea group) is more preferably 100/0 to 96/4, and even more preferably 100/0 to 97/3. In the present embodiment, isocyanurate group/(urethane group+urea group) can be measured by using an ATR method for FT-IR, and specifically can be measured by using a method to be described later in Examples.

The "polyisocyanate cured product" according to the present embodiment refers to one having, in addition to satisfying the above conditions, a remaining weight percentage of 45% or more in gel fraction measurement. In the present embodiment, approximately 0.1 g of a sample is soaked in acetone at 20° C. for 24 hours. The sample is taken out and then dried at 105° C. for 1 hour, and the weight of the resultant sample is measured and the gel fraction is determined from the percentage of the remaining weight after soaking to the sample weight before soaking. For the solvent, solvents other than acetone may be used, such as xylene, toluene, methyl ethyl ketone, benzene, and water. The measurement may be performed with the temperature or time changed in accordance with the object or application. Alternatively, a method for determining a degree of crosslinking described in JIS C3005 "Test methods for rubber or plastic insulated wires and cables" may be referred to.

The polyisocyanate cured product according to the present embodiment is suitable for a sealing material and reflector for an optical semiconductor device including an optical semiconductor element sealed therein because of better thermal resistance and water vapor impermeability than polyisocyanate cured products having a urethane or urea group.

The polyisocyanate cured product according to the present embodiment has a feature of having a small yellowness index (hereinafter, also referred to as "YI"). The YI of the polyisocyanate cured product according to the present embodiment in the case of 1 mm thickness is preferably 10 or smaller, more preferably 9 or smaller, and even more preferably 8 or smaller. The lower limit of the YI is not limited, and for example, is 0.1 or larger.

In the present embodiment, YI measurement is performed as in the following: a sample of a polyisocyanate cured product having a thickness of 1 mm is measured for transmittance in 380 to 780 nm with a spectrophotometer; from the measurement result with the spectrophotometer, X, Y, and Z are determined in accordance with JIS Z8701; and a YI is calculated from the determined X, Y, and Z in accordance with JIS K7373 and JIS Z8720.

The polyisocyanate cured product according to the present embodiment has a feature of having good thermal yellowing resistance. In the present embodiment, thermal yellowing resistance is determined by using the following method: a polyisocyanate cured product (thickness: 1 mm) is left to stand at 150° C. for 144 hours; and the YI change between before and after the standing is measured. The YI change in a thermal yellowing resistance test of the polyisocyanate cured product according to the present embodiment is preferably 10 or smaller, more preferably 8 or smaller, even more preferably 5 or smaller, furthermore preferably 3 or smaller, and particularly preferably 0.

In the case that a sample having a thickness of 1 mm is not available, an YI value in the case of 1 mm thickness is calculated by using the following equation.

$$YI = 7.95 \times \text{Thickness (mm)} + \text{constant}$$

The polyisocyanate cured product according to the present embodiment further has a feature of having good thermal resistance. The thermal resistance of the polyisocyanate cured product according to the present embodiment is evaluated by using, for example 1% weight reduction temperature (hereinafter, also denoted as "Td1") and 5% weight reduction temperature (hereinafter, also denoted as "Td5").

Td1 of the polyisocyanate cured product according to the present embodiment is preferably 200° C. or higher, more preferably 230° C. or higher, and even more preferably 250° C. or higher. The upper limit of Td1 is not limited, and is, for example, 600° C. or lower.

Td5 of the polyisocyanate cured product according to the present embodiment is preferably 260° C. or higher, more preferably 310° C. or higher, and even more preferably 360° C. or higher. The upper limit of Td5 is not limited, and is, for example, 700C or lower.

The polyisocyanate cured product having the above-described yellowness index characteristics and thermal resistance can be obtained by, for example, subjecting a polyisocyanate composition having a compound resulting from isocyanuratization of at least one diisocyanate selected from the group consisting of an aliphatic diisocyanate and an alicyclic diisocyanate to an isocyanuratization reaction under a substantially solvent-free condition until the disappearance rate of an isocyanate group (NCO group) in the polyisocyanate composition reaches 90% or higher.

In the present embodiment, Td1 and Td5 can be measured by using a method to be described later in Examples.

The concentration of a catalyst-derived cation in the polyisocyanate cured product according to the present embodiment is preferably 100 ppm or less. The polyisocyanate cured product according to the present embodiment has a good yellowness index and thermal yellowing resistance if the concentration of a catalyst-derived cation is 100 ppm or less. The concentration of the catalyst-derived cation is more preferably 80 ppm or less, even more preferably 60 ppm or less, and furthermore preferably 40 ppm or less. The lower limit of the concentration of the catalyst-derived cation is not limited, and is, for example, 0.1 ppm or more.

The polyisocyanate cured product according to the present embodiment has good water vapor impermeability. The water vapor permeability can be measured in accordance with JIS Z0208. When the polyisocyanate cured product according to the present embodiment having a thickness of 0.2 mm is left to stand under conditions of a temperature of 40° C. and a humidity of 90RH % for 24 hours, the water vapor transmission rate is preferably 0.01 to 40 g/m$^2$. If the water vapor transmission rate is 40 g/m$^2$ or smaller, the water vapor impermeability is good. The water vapor transmission rate of the polyisocyanate cured product according to the present embodiment is preferably 35 g/m$^2$ or smaller, more preferably 30 g/m$^2$ or smaller, and even more preferably 25 g/m$^2$ or smaller.

<<Method for Producing Polyisocyanate Cured Product>>

Next, a method for producing a polyisocyanate cured product according to the present embodiment will be described.

In the method for producing a polyisocyanate cured product according to the present embodiment, (a) a polyisocyanate composition comprising: a polyisocyanate obtained from at least one diisocyanate selected from the group consisting of an aliphatic diisocyanate and an alicyclic diisocyanate and having an isocyanurate group; and a polyisocyanate obtained from at least one diisocyanate selected from the group consisting of an aliphatic diisocyanate and an alicyclic diisocyanate and having an allophanate group; and (b) an isocyanuratization catalyst are used as starting materials, and the method includes:

a step of performing isocyanuratization reaction under a substantially solvent-free condition until the disappearance rate of the isocyanate group (NCO group) in the polyisocyanate composition reaches 90% or higher.

The polyisocyanate cured product according to the present embodiment can be manufactured by using (a) a polyisocyanate composition and (b) an isocyanuratization catalyst as starting materials. Specifically, the polyisocyanate cured product according to the present embodiment can be manufactured by subjecting the (a) polyisocyanate composition to isocyanuratization reaction with the isocyanuratization catalyst.

The (a) polyisocyanate composition used as a starting material has a polyisocyanate obtained from at least one diisocyanate selected from the group consisting of an aliphatic diisocyanate and an alicyclic diisocyanate and having an isocyanurate group, and a polyisocyanate obtained from at least one diisocyanate selected from the group consisting of an aliphatic diisocyanate and an alicyclic diisocyanate and having an allophanate group.

The polyisocyanate composition may have a polyisocyanate having an isocyanurate group and an allophanate group in one molecule, or may have a polyisocyanate having only an isocyanurate group in one molecule and a polyisocyanate having only an allophanate group in one molecule.

An isocyanurate group is composed of three molecules of a diisocyanate monomer, and is represented by the following formula (1).

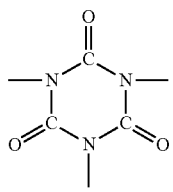

(1)

An allophanate group is formed from a hydroxy group of an alcohol and an isocyanate group, and is represented by the following formula (2).

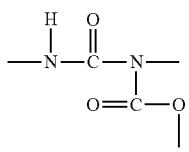

(2)

In the case that an isocyanurate group-containing polyisocyanate, an allophanate group-containing polyisocyanate, or a polyisocyanate having an isocyanurate group and an allophanate group is derived from a diisocyanate monomer, it is preferred to use a urethanization, isocyanuratization, and allophanatization catalyst. Specifically, catalysts having basicity are preferred for the urethanization, isocyanuratization, and allophanatization catalyst in general, and examples thereof include 1) hydroxides of a quaternary organic ammonium such as tetramethylammonium, tetraethylammonium, tetrabutylammonium, and trimethylbenzylammonium with a weak organic acid such as acetic acid and capric acid; 2) hydroxides of a hydroxyalkylammonium such as trimethylhydroxypropylammonium, trimethylhydroxyethylammonium, triethylhydroxypropylammonium, and triethylhydroxyethylammonium with a weak organic acid such as acetic acid and capric acid; 3) salts of metal such as tin, zinc, lead, sodium, and potassium with an alkylcarboxylic acid such as acetic acid, caproic acid, octylic acid, and myristic acid; 4) alcoholates of metal such as sodium and potassium; 5) aminosilyl group-containing compounds such as hexamethyldisilazane; 6) Mannich bases; and 7) combination use of a tertiary amine and an epoxy compound. Preferred are the 1), 2), and 3). Aminosilyl group-containing compounds cause a side reaction such as uretdione formation depending on the use conditions. More preferred is 1), even more preferred is a salt of a tetraalkylammonium with a weak organic acid such as acetic acid and capric acid, and particularly preferred is tetramethylammonium caprate.

The polyisocyanate in the (a) polyisocyanate composition used in the present embodiment preferably has an isocyanurate group and an allophanate group. In this case, the molar ratio of the isocyanurate group to the allophanate group (hereinafter, also referred to as "molar ratio of isocyanurate group/allophanate group") in the polyisocyanates in the (a) polyisocyanate composition, measured for the polyisocyanate cured product obtained by the polyisocyanate composition according to the present embodiment, is preferably 99/1 to 30/70, more preferably 98/2 to 40/60, and even more preferably 97/3 to 50/50. If the molar ratio of isocyanurate group/allophanate group in the polyisocyanates in the (a) polyisocyanate composition is in the range of 99/1 to 30/70, a polyisocyanate cured product to be obtained has good thermal resistance, thermal yellowing resistance, and adhesion to a base material. The molar ratio of isocyanurate group/allophanate group in the polyisocyanates in the (a) polyisocyanate composition can be determined by using 1H-NMR, and specifically can be measured by using a method to be described later in Examples.

The (a) polyisocyanate composition used in the present embodiment is preferably a polyisocyanate composition obtained by using an alcohol as one of starting materials. For the alcohol, it is preferred to use at least one selected from the group consisting of monoalcohols, dialcohols, and tri- or more alcohols. Among them, monoalcohols are more preferred because they lower the viscosity of the (a) polyisocyanate composition. One of the monoalcohols may be used, or two or more thereof may be used in a mixture. In the present embodiment, the number of carbon atoms of the monoalcohol is not limited, but the lower limit of the number of carbon atoms of the monoalcohol is preferably 3, more preferably 4, and even more preferably 6. The upper limit of the number of carbon atoms of the monoalcohol is preferably 16, more preferably 13, and even more preferably 9. If the number of carbon atoms of the monoalcohol is 3 or more, the adhesion to a base material is good, and if the number of carbon atoms of the monoalcohol is 16 or less, the gas barrier properties and water vapor impermeability of the polyisocyanate cured product are good.

The monoalcohol used in the present embodiment may have an alcohol having an ether group in the molecule such as 1-butoxyethanol, 2-butoxyethanol, 1-butoxypropanol, 2-butoxypropanol, 3-butoxypropanol, ethylene glycol monobutyl ether, and propylene glycol monomethyl ether; an alcohol having an ester group; an alcohol having a carbonyl group; or an alcohol having a phenyl group such as benzyl alcohol, but is preferably a monoalcohol composed only of a saturated hydrocarbon group. Branched monoalcohols are more preferred. Examples of such a monoalcohol include, but not limited to, methanol, ethanol, 1-propanol, 2-propanol, 1-butanol, 2-butanol, isobutanol, 1-pentanol, 2-pentanol, isoamyl alcohol, 1-hexanol, 2-hexanol, 1-heptanol, 1-octanol, 2-ethyl-1-hexanol, 3,3,5-trimethyl-1-hexanol, tridecanol, pentadecanol, palmityl alcohol, stearyl alcohol, cyclopentanol, cyclohexanol, methylcyclohexanol, and trimethylcyclohexanol. Among them, 1-propanol, 2-propanol, isobutanol, n-butanol, isoamyl alcohol, 1-hexanol, 1-heptanol, 1-octanol, 2-ethyl-1-hexanol, 3,3,5-trimethyl-1-hexanol, tridecanol, pentadecanol, palmityl alcohol, stearyl alcohol, and 1,3,5-trimethylcyclohexanol are more preferred because they provide good adhesion to an base material and gas barrier properties. Even more preferred are isobutanol, 1-butanol, isoamyl alcohol, pentanol, 1-hexanol, 2-hexanol, 1-heptanol, 1-octanol, 2-octanol, 2-ethyl-1-hexanol, 3,3,5-trimethyl-1-hexanol, and tridecanol, because they lower the viscosity. Particularly preferred are 2-hexanol, 2-octanol, 2-ethyl-1-hexanol, and 3,3,5-trimethyl-1-hexanol, because of very high compatibility with various additives.

The (a) polyisocyanate composition used in the present embodiment may have a uretdione-based form. The uretdione-based form has a viscosity-lowering effect, but if the uretdione-based form is present at too much content, it decomposes at a high temperature when being incorporated in a polyisocyanate cured product, and as a result the performance of the polyisocyanate cured product may be degraded. In the (a) polyisocyanate composition used in the present embodiment, the content of the uretdione-based form is preferably 15% by mass or less, more preferably 10% by mass or less, and even more preferably 5% by mass or less. The content of the uretdione-based form can be determined by measuring the peak area percentage at a molecular weight of approximately 336 in gel permeation chromatography (hereinafter, abbreviated as GPC) with a differential refractometer. In the case that a peak which interferes with measurement is present near the peak at a molecular weight of approximately 336, the content of the uretdione-based form can be determined by using an alternative method to quantify the ratio of the peak height of a uretdione group at approximately 1770 $cm^{-1}$ to the peak height of an allophanate group at approximately 1720 $cm^{-1}$ with use of a Fourier transform infrared spectrophotometer (hereinafter, abbreviated as FT-IR) with an internal standard. Hereinafter, the measurement method for GPC will be described. Measurements in terms of the molecular weight of a polyisocyanate compound are all obtained in accordance with the following measurement method. Instrument used: HLC-8120 (manufactured by Tosoh Corporation); columns used: TSK GEL SuperH1000, TSK GEL SuperH2000, and TSK GEL SuperH3000 (all manufactured by Tosoh Corporation); sample concentration: 5 wt/vol % (e.g., 50 mg of sample dissolved in 1 ml of THF); carrier: THF; detection means: differential refractometer; elution rate: 0.6 ml/min.; and column temperature: 30° C. The calibration curve of GPC is prepared by using, as standards, a polystyrene having a molecular weight of 50000 to 2050 (PSS-06 (Mw 50000), BK13007 (Mp=20000, Mw/Mn=1.03), PSS-08 (Mw=9000), PSS-09 (Mw=4000), 5040-35125 (Mp=2050, Mw/Mn=1.05), all manufactured by GL Sciences Inc.), a trimer to heptamer of an isocyanurate-based form (molecular weight of isocyanurate trimer=504, molecular weight of isocyanurate pentamer=840, and molecular weight of isocyanurate heptamer=1176) and HDI (molecular weight=168) in a hexamethylene diisocyanate-based polyisocyanate composition (DURANATE TPA-100, manufactured by Asahi Kasei Chemicals Corporation).

The (a) polyisocyanate composition used in the present embodiment may have a urethane-based form. The urethane-based form enhances the adhesion to a base material, but if the urethane-based form is present at too much content, the thermal resistance of the polyisocyanate cured product is deteriorated. In the (a) polyisocyanate composition used in the present embodiment, the content of the urethane-based form is preferably 5% by mass or less, more preferably 4% by mass or less, and even more preferably 3% by mass or less. The content of the urethane-based form can be determined by using 1H-NMR. The total amount by mole of the allophanate group and the isocyanurate group is measured in accordance with the above method, and the amount by mole of a urethane group is further determined from the signal area around 4 to 5 ppm derived from a hydrogen atom bonding to a nitrogen atom in a urethane group (1 mol of hydrogen atoms per 1 mol of urethane groups), and from these results the content of the urethane-based form can be determined.

In producing the (a) polyisocyanate composition, it is preferred to allow an alcohol and a diisocyanate to undergo urethanization reaction, allophanatization reaction, and isocyanuratization reaction simultaneously. Optionally, urethanization, allophanatization, and isocyanuratization may be performed separately. Alternatively, allophanatization and isocyanuratization may be performed simultaneously after urethanization.

The amount of the urethanization, isocyanuratization, and allophanatization catalyst to be used is preferably 0.001 to 2% by mass, and more preferably 0.01 to 0.5% by mass, based on the total mass of the reaction solution. If the amount of the urethanization, isocyanuratization, and allophanatization catalyst to be used is 0.001% by mass or more, the effect of the catalyst can be sufficiently exerted. If the amount of the urethanization, isocyanuratization, and allophanatization catalyst to be used is 2% by mass or less, control of the reaction is facilitated.

In producing the (a) polyisocyanate composition, the method for adding a urethanization, isocyanuratization, and allophanatization catalyst is not limited. Examples of the method for addition may be a method in which a required amount of an allophanatization catalyst is added in a batch, or a method in which a required amount of an allophanatization catalyst is added separately in several portions. Alternatively, a method in which a required amount of an allophanatization catalyst is added continuously at a constant addition rate may be employed.

In producing the (a) polyisocyanate composition, it is preferred to allow urethanization reaction, isocyanuratization reaction, and allophanatization reaction to proceed in a solvent-free state, but, as necessary, a low-polar organic solvent to be described later, or an ester solvent such as ethyl acetate and butyl acetate; a ketone solvent such as methyl ethyl ketone; an aromatic solvent such as toluene, xylene, and diethylbenzene; an organic solvent having no reactivity to an isocyanate group such as dialkyl polyalkylene glycol ethers; and a mixture of them may be used as a solvent.

In the present embodiment, the process of urethanization reaction, isocyanuratization reaction, and allophanatization reaction can be traced by measuring the NCO group content or refractivity of the reaction solution.

Urethanization reaction, isocyanuratization reaction, and allophanatization reaction can be terminated by cooling to room temperature or by adding a reaction terminator. In the case that a catalyst is used, however, adding a reaction terminator is preferred because a side reaction can be inhibited. The amount of the reaction terminator to be added is preferably 0.25 to 20 times, more preferably 0.5 to 16 times, and even more preferably 1.0 to 12 times the molar amount of the catalyst. If the amount of the reaction terminator to be added is 0.25 or more times the molar amount of the catalyst, complete deactivation can be achieved. If the amount of the reaction terminator to be added is 20 or less times the molar amount of the catalyst, the storage stability is good. For the reaction terminator, any reaction terminator may be used as long as it deactivates the catalyst. Examples of the reaction terminator include, but not limited to, compounds which exhibit phosphoric acidity such as phosphoric acid and pyrophosphoric acid; monoalkyl esters or dialkyl esters of phosphoric acid, pyrophosphoric acid, or the like; halogenated acetic acid such as monochloroacetic acid; benzoyl chloride, sulfonates, sulfuric acid, sulfates, ion-exchange resins, and chelating agents. Preferred are phosphoric acid, pyrophosphoric acid, metaphosphoric acid, polyphosphoric acids, and monoalkyl phosphates and dialkyl phosphates from an industrial viewpoint, because they are less likely to cause the corrosion of a stainless steel. Examples of the monophosphate and diphosphate include, but not limited to, monoethyl phosphate, diethyl phosphate, monobutyl phosphate, dibutyl phosphate, mono(2-ethylhexyl) phosphate, di(2-ethylhexyl) phosphate, monodecyl phosphate, didecyl phosphate, monolauryl phosphate, dilauryl phosphate, monotridecyl phosphate, ditridecyl phosphate, monooleyl phosphate, and dioleyl phosphate, and a mixture of them.

In addition, terminating the reaction with an adsorbent and terminating the reaction with an adsorbent and the above reaction terminator in combination are preferred methods. Examples of the adsorbent include, but not limited to, silica gel and activated carbon. The amount of the adsorbent to be added is preferably 1.4 to 3000 times, more preferably 7.0 to 1500 times, and even more preferably 10.0 to 700 times the mass of the catalyst. If the amount of the adsorbent to be added is 1.4 or more times the mass of the catalyst, a sufficient performance is ensured to adsorb a catalyst remaining in the polyisocyanate composition, a thermally deactivated catalyst, reaction products between the reaction terminator and the catalyst, an unreacted reaction terminator, and the like. If the amount of the adsorbent to be added is 3000 or less times the mass of the catalyst, it is easy to remove the adsorbent from the polyisocyanate composition.

After the completion of the reaction, an unreacted diisocyanate or the solvent may be separated from a polyisocyanate composition to be obtained. From the viewpoint of safety, it is preferred to separate an unreacted diisocyanate. Examples of the method for separating an unreacted diisocyanate or the solvent include, but not limited to, a thin film distillation method and a solvent extraction method.

The NCO group content of the polyisocyanates in the (a) polyisocyanate composition used in the present embodiment is preferably 5.0 to 25.0% by mass in a solvent-free and diisocyanate-free state. The lower limit of the NCO group content of the polyisocyanates in the (a) polyisocyanate composition is more preferably 7.0% by mass, and even more preferably 10.0% by mass. The upper limit of the NCO group content of the polyisocyanates in the (a) polyisocyanate composition is preferably 24.0% by mass, and more preferably 23.0% by mass. If the NCO group content of the polyisocyanates in the (a) polyisocyanate composition is in the range of 5.0 to 25.0% by mass, a polyisocyanate composition having a low viscosity and good compatibility with various additives can be obtained, and thus a polyisocyanate cured product having sufficient thermal resistance and thermal yellowing resistance can be obtained.

In the present embodiment, a "solvent-free and diisocyanate-free state" refers to a state in which the content of a solvent and/or a diisocyanate is less than 1% by mass.

The viscosity at 25° C. of the (a) polyisocyanate composition used in the present embodiment is preferably 100 to 20000 mPa·s in a solvent-free and diisocyanate-free state. The lower limit of the viscosity is more preferably 150 mPa·s. The upper limit of the viscosity is more preferably 10000 mPa·s. If the viscosity is 100 mPa·s or higher, a polyisocyanate cured product having sufficient crosslinking characteristics can be obtained. If the viscosity is 20000 mPa·s or lower, a polyisocyanate cured product having good compatibility with various additives can be obtained.

The number average functionality of the NCO group of the polyisocyanates in the (a) polyisocyanate composition used in the present embodiment is preferably 2.1 or more, more preferably 2.2 or more, and even more preferably 2.4 or more. If the number average functionality of the NCO group of the polyisocyanates in the (a) polyisocyanate composition is 2.1 or more, the polyisocyanate cured product has a higher crosslinking density, and becomes tougher. The upper limit of the number average functionality of the NCO group of the polyisocyanates in the (a) polyisocyanate composition is not limited, and is, for example, 8.0 or less.

The (a) polyisocyanate composition used in the present embodiment may be used in a mixture with an organic solvent. Examples of the organic solvent include, but not limited to, aromatic hydrocarbon solvents, aliphatic hydrocarbon solvents, alicyclic hydrocarbon solvents, ester solvents, ether solvents, and low-polar organic solvents, and one of them may be used singly, or a mixture thereof may be used. Here, a low-polar organic solvent refers to an organic solvent having an aliphatic or alicyclic hydrocarbon solvent as a main component, and may contain a small amount of an aromatic hydrocarbon solvent, an ester solvent, an ether solvent, or the like.

In the method for producing a polyisocyanate cured product according to the present embodiment, (c) an antioxidant may be further used as a starting material. The (c) antioxidant may be added in a stage of producing a polyisocyanate cured product, or may be added to the (a) polyisocyanate composition in advance. In addition, two or more (c) antioxidants may be used in combination.

Examples of the (c) antioxidant include, but not limited to, light stabilizers and thermal stabilizers.

Examples of the light stabilizer include, but not limited to, hindered amine light stabilizers, benzophenone light stabilizers, benzotriazole light stabilizers, triazine light stabilizers, and cyanoacrylate light stabilizers. Examples of the hindered amine light stabilizer include, but not limited to, ADK STAB LA-52, ADK STAB LA-68, and ADK STAB LA-77Y (trade name, all manufactured by ADEKA CORPORATION); and Tinuvin 622, Tinuvin 765, Tinuvin 770, and Tinuvin 791 (trade name, all manufactured by BASF SE). Examples of the benzophenone light stabilizer include, but not limited to, Chimassorb 81 (trade name, manufactured by BASF SE). Examples of the benzotriazole light stabilizer include, but not limited to, Tinuvin P and Tinuvin 234 (trade name, all manufactured by BASF SE). Examples of the triazine light stabilizer include, but not limited to, Tinuvin 1577ED (trade name, manufactured by BASF SE).

Examples of the cyanoacrylate light stabilizer include, but not limited to, Uvinul 3035 (trade name, manufactured by BASF SE).

Examples of the thermal stabilizer include, but not limited to, hindered phenol thermal stabilizers, phosphorus-containing thermal stabilizers, sulfur-containing thermal stabilizers, vitamin E type thermal stabilizers, and hydroxyamine thermal stabilizers. Examples of the hindered phenol thermal stabilizer include, but not limited to, dibutylhydroxytoluene (hereinafter, abbreviated as BHT); Irganox 1010, Irganox 1135, Irganox 1330, Irganox 3114, Irganox 565, and Irganox 1520L (trade name, all manufactured by BASF SE); and ADK STAB AO-20, ADK STAB AO-30, ADK STAB AO-50, ADK STAB AO-60, and ADK STAB AO-80 (trade name, all manufactured by ADEKA CORPORATION). Examples of the phosphorus-containing thermal stabilizer include, but not limited to, Irgafos 168 and Irgafos 38 (trade name, all manufactured by BASF SE); ADK STAB PEP-8, ADK STAB HP-10, ADK STAB 1178, and ADK STAB C (trade name, all manufactured by ADEKA CORPORATION); and Sumilizer GP (trade name, manufactured by Sumitomo Chemical Co., Ltd.). Examples of the sulfur-containing thermal stabilizer include, but not limited to, Irganox PS800FL (trade name, manufactured by BASF SE). Examples of the vitamin E type thermal stabilizer include, but not limited to, Irganox E201 (trade name, manufactured by BASF SE). Examples of the hydroxyamine thermal stabilizer include, but not limited to, Irgastab FS042 (trade name, manufactured by BASF SE).

Suitable for the (c) antioxidant in the method for producing a polyisocyanate cured product according to the present embodiment is at least one selected from the group consisting of a hindered phenol antioxidant, a hindered amine antioxidant, a sulfur-containing antioxidant, and a phosphorus-containing antioxidant. More preferred for the (c) antioxidant are Tinuvin 765, BHT, Irganox 565, ADK STAB C, and Sumilizer GP, and among them, BHT and Sumilizer GP are even more preferred because even a small addition of them is effective.

In the method for producing a polyisocyanate cured product according to the present embodiment, various additives such as a curing accelerator as a promoter, a silane coupling agent to enhance the adhesiveness, a hydrophilizing agent for the surface of a coating film, a catalyst, a leveling agent, a plasticizer, a surfactant, a coloring pigment, and a dye may be used in a mixture in accordance with the object and application, within a range which does not impair the advantageous effects of the present invention. These additives may be added in a stage of producing a polyisocyanate cured product, or may be added to the (a) polyisocyanate composition in advance. In addition, two or more of these additives may be used in combination.

Examples of the curing accelerator as a promoter for a polyisocyanate cured product include, but not limited to, dialkyltin dicarboxylates such as dibutyltin dilaurate, dioctyltin dilaurate, and dibutyltin diacetate; tin oxide compounds such as dibutyltin oxide; metal carboxylates such as tin 2-ethylhexanoate, zinc 2-ethylhexanoate, and cobalt salts; and tertiary amines such as triethylamine, pyridine, methylpyridine, benzyldimethylamine, N,N-dimethylcyclohexylamine, N-methylpiperidine, pentamethyldiethylenetriamine, N,N'-endoethylenepiperazine, and N,N'-dimethylpiperazine.

For the (b) isocyanuratization catalyst used in the present embodiment, the above-described urethanization, isocyanuratization, and allophanatization catalyst may be used. Specifically, catalysts having basicity are preferred for the urethanization, isocyanuratization, and allophanatization catalyst in general, and examples thereof include 1) hydroxides of a quaternary organic ammonium such as tetramethylammonium, tetraethylammonium, tetrabutylammonium, and trimethylbenzylammonium with a weak organic acid such as acetic acid and capric acid; 2) hydroxides of a hydroxyalkylammonium such as trimethylhydroxypropylammonium, trimethylhydroxyethylammonium, triethylhydroxypropylammonium, and triethylhydroxyethylammonium with a weak organic acid such as acetic acid and capric acid; salts of metal such as tin, zinc, lead, sodium, and potassium with an alkylcarboxylic acid such as acetic acid, caproic acid, octylic acid, and myristic acid; 4) alcoholates of metal such as sodium and potassium; 5) aminosilyl group-containing compounds such as hexamethyldisilazane; 6) Mannich bases; and 7) combination use of a tertiary amine and an epoxy compound. Preferred are the 1), 2), and 3). Aminosilyl group-containing compounds cause a side reaction such as uretdione formation depending on the use conditions. More preferred is 1) quaternary organic ammonium salts, even more preferred is a salt of a tetraalkylammonium with a weak organic acid such as acetic acid and capric acid, and particularly preferred is tetramethylammonium caprate.

The amount of the (b) isocyanuratization catalyst added is preferably in the range of 100 to 10000 ppm based on the solid content of the (a) polyisocyanate composition. If the amount of the (b) isocyanuratization catalyst added is 100 ppm or more, sufficient reactivity is achieved, and if the amount of the (b) isocyanuratization catalyst added is 10000 ppm or less, the physical properties of a polyisocyanate cured product are not affected. The lower limit of the amount of the (b) isocyanuratization catalyst added is more preferably 500 ppm or more, even more preferably 1000 ppm or more, and particularly preferably 1500 ppm or more. The upper limit of the (b) isocyanuratization catalyst added is more preferably 5000 ppm or less, and even more preferably 3000 ppm or less.

The reaction temperature in the method for producing a polyisocyanate cured product according to the present embodiment is not limited, but is preferably 60 to 200° C. from the viewpoint of curability and color tone. If the reaction temperature is 60° C. or higher, the curability of a polyisocyanate cured product is acceptable, and if the reaction temperature is 200° C. or lower, the color tone, especially the yellowness index of a polyisocyanate cured product is small. The reaction temperature is more preferably 80 to 180° C., even more preferably 100 to 170° C., and furthermore preferably 120 to 160° C.

For the (b) isocyanuratization catalyst, a diluent may be used, as necessary. For the diluent, a substance which reacts with the NCO group of the polyisocyanates in the polyisocyanate composition and is incorporated in the system can be used. Examples of the diluent which can be used include, but not limited to, compounds having an active hydrogen group, and especially alcohol solvents are preferred because they lower the viscosity to enhance the dispersiveness of the catalyst. One of these diluents may be used singly, or two or more thereof may be used in a mixture.

In the method for producing a polyisocyanate cured product according to the present embodiment, the step of performing isocyanuratization reaction is carried out under a substantially solvent-free condition. The substantially solvent-free condition refers to a condition that the content of a solvent is 5% by mass or less based on the (a) polyisocyanate composition. If the content of a solvent is 5% by mass or less based on the (a) polyisocyanate composition, the influence of the weight reduction of a polyisocyanate cured product can be ignored. The content of a solvent is preferably 3% by mass or less, and more preferably 1% by mass or less, based on the (a) polyisocyanate composition.

In the method for producing a polyisocyanate cured product according to the present embodiment, isocyanuratization reaction is performed in the step of performing isocyanuratization reaction until the disappearance rate of the isocyanate group in the (a) polyisocyanate composition reaches 90% or higher. If the disappearance rate of the isocyanate group in the (a) polyisocyanate composition is 90% or higher, the polyisocyanate cured product has sufficient thermal resistance, etc. The disappearance rate of the isocyanate group in the (a) polyisocyanate composition is more preferably 91% or higher, and even more preferably 92% or higher.

<<Applications>>

The polyisocyanate cured product according to the present embodiment has thermal resistance and impact resistance in combination, and further has good moisture/reflow sensitivity. Accordingly, the polyisocyanate cured product according to the present embodiment can be used for starting materials for a coating material, a sealing material, a foam, and a plastic material. Especially, the polyisocyanate cured product according to the present embodiment is particularly suitable for a sealing material and reflector to be used in production of an optical semiconductor element because of the feature of having good water vapor impermeability.

An optical semiconductor device according to the present embodiment is an optical semiconductor device including an optical semiconductor element sealed therein with the above-described polyisocyanate cured product and/or including the above-described polyisocyanate cured product as a reflector.

EXAMPLES

Hereinafter, the present invention will be described in more detail with reference to Examples and Comparative Examples, but the present invention is never limited to the following Examples in a range not departing from the gist of the present invention.

Measurement methods in the present Examples were as follows.

<NCO Group Content>

The isocyanate group (NCO group) content of polyisocyanates in a polyisocyanate composition was determined by reacting the isocyanate group of polyisocyanates in a polyisocyanate composition with an excessive amount of 2 N amine (a toluene solution of di-n-butylamine) followed by back titration of the resultant reaction solution with 1 N hydrochloric acid.

<Viscosity>

Viscosity was measured with a Model E viscometer (manufactured by Tokimec, Inc.) at 25° C.

In the measurement, a standard rotor (1°34'×R24) was used, and the number of rotations of the standard rotor was set as follows.

100 r.p.m. (in the case that viscosity was smaller than 128 mPa·s)

50 r.p.m. (in the case that viscosity was 128 mPa·s to 256 mPa·s)

20 r.p.m. (in the case that viscosity was 256 mPa·s to 640 mPa·s)

10 r.p.m. (in the case that viscosity was 640 mPa·s to 1280 mPa·s)

5 r.p.m. (in the case that viscosity was 1280 mPa·s to 2560 mPa·s)

<Number Average Functionality>

The number average functionality of the isocyanate group (NCO group) in polyisocyanates in a polyisocyanate composition was determined by using the following equation.

$$\text{number average functionality} = \frac{(NCO \text{ group content}) \times (\text{number average molecular weight obtained by } GPC)}{42}$$

<Molar Ratio of Isocyanurate Group/Allophanate Group in Polyisocyanates in Polyisocyanate Composition>

The molar ratio of isocyanurate group/allophanate group in polyisocyanates in a polyisocyanate composition was determined as in the following. First, a polyisocyanate composition was dissolved in deuterated chloroform at a concentration of 10% by mass (with 0.03% by mass of tetramethylsilane based on the polyisocyanate composition added thereto), and the resultant solution was subjected to measurement by using 1H-NMR (BioSpin Avance 500, manufactured by Bruker BioSpin K.K.). For the chemical shift reference, the hydrogen signal of tetramethylsilane was set to 0 ppm. From a spectrum obtained in the 1H-NMR measurement were determined the signal area around 8.5 ppm derived from a hydrogen atom bonding to a nitrogen atom in an allophanate group (1 mol of hydrogen atoms per 1 mol of allophanate groups) and the signal area around 3.85 ppm derived from a hydrogen atom in a methylene group adjacent to an isocyanurate group (6 mol of hydrogen atoms per 1 mol of isocyanurate groups).

On the basis of the measurements, the molar ratio of isocyanurate group/allophanate group was determined by calculating (signal area around 3.85 ppm/6)/(signal area around 8.5 ppm).

<Disappearance Rate>

An IR spectrum was measured for a polyisocyanate composition before reaction and a polyisocyanate cured product after reaction in accordance with an ATR method for FT-IR (FT/IR-4200, manufactured by JASCO Corporation). On the basis of the measurement results, the disappearance rate of the isocyanate group (NCO group) was determined by using the following equation.

$$\text{disappearance rate } [\%] = 1 - \frac{\text{peak height ratio of } NCO \text{ group to } CH_2 \text{ group after reaction}}{\text{peak height ratio of } NCO \text{ group to } CH_2 \text{ group before reaction}} = 1 - \frac{h_{NCO}/h_{CH2}}{h_{0,NCO}/h_{0,CH2}}$$

NCO group peak: around 2270 $cm^{-1}$, $CH_2$ group peak: around 2930 $cm^{-1}$

<Molar Ratio of Isocyanurate Group/(Urethane Group+Urea Group) in Polyisocyanate Cured Product>

An IR spectrum was measured for a polyisocyanate cured product in accordance with an ATR method for FT-IR (FT/IR-4200, manufactured by JASCO Corporation). From the carbonyl group peak (around 1690 $cm^{-1}$) of the isocyanurate group and the N—H peak (around 3400 $cm^{-1}$) of the urethane and urea groups, the molar ratio of isocyanurate group/(urethane group+urea group) was determined.

<Molar Ratio of Isocyanurate Group/Allophanate Group in Polyisocyanate Cured Product>

The molar ratio of isocyanurate group/allophanate group in a polyisocyanate cured product was determined as in the following. First, a polyisocyanate cured product was frozen and crashed, and the resultant crashed product was subjected to measurement by using 13C-NMR DD/MAS (DipolarDecoupling/Magic Angle Spinning) (BioSpin Avance 500, manufactured by Bruker BioSpin K.K.). From a spectrum obtained in the measurement were determined the signal area (around 149 ppm) derived from the carbonyl group of the isocyanurate group and the signal area (a region of 152 to 160 ppm) derived from the carbonyl group of the allophanate group. On the basis of the results, the molar ratio of isocyanurate group/allophanate group was determined by calculating (signal area around 149 ppm/3)/(signal area in region of 152 to 160 ppm/2).

<Yellowness Index (YI)>

YI measurement was performed as in the following. The transmittance in 380 to 780 nm was measured for a sample of a polyisocyanate cured product having a thickness of 1 mm with a spectrophotometer (V-650, manufactured by JASCO Corporation). From the measurement result with the spectrophotometer, X, Y, and Z were determined in accordance with JIS Z8701. From the X, Y, and Z determined, the YI was calculated in accordance with JIS K7373 and JIS Z8720.

<Thermal Yellowing Resistance Test>

Thermal yellowing resistance was determined by using the following method. A sample of a polyisocyanate cured product having a thickness of 1 mm was left to stand at 150° C. for 6 days (144 hours). The YI was measured before and after the standing by using the above-described method, and the YI change was determined.

<Thermogravimetric Analysis>

Thermogravimetric analysis was performed by using TG-DTA (TG/DTA6200, manufactured by Seiko Instruments Inc.) under conditions of a nitrogen flow rate of 100 ml/min and a temperature elevation rate of 10° C./min. Td1 and Td5 refer to 1% weight reduction temperature and 5% weight reduction temperature, respectively.

<Impact Resistance Test>

An impact resistance test was performed by using a Du Pont type impact resistance tester as in the following. A ¼ inch impact head was set on a sample of a polyisocyanate cured product having a thickness of 1 mm, and a weight of 1000 g was allowed to fall from a predetermined height, and the presence or absence of a crack of the coating film was visually checked. The maximum height (cm) among heights at which a crack of the coating film was not found was presented as the impact resistance.

<Water Vapor Permeability Test>

A water vapor permeability test was performed as in the following. A polyisocyanate cured product having a thickness of 0.2 mm was subjected to measurement in accordance with JIS Z0208 (Testing Methods for Determination of the Water Vapour Transmission Rate of Moisture-Proof Packaging Materials) under the conditions B (temperature: 40° C., humidity: 90RH %).

<Moisture/Reflow Sensitivity Test>

A starting material for a polyisocyanate cured product was potted on a reflector for LEDs (505010-8R, manufactured by TTOP Corp.), and cured under predetermined conditions to produce a reflector sample for LEDs sealed with the polyisocyanate cured product. The sample produced was left to stand in a thermo-hygrostatic oven maintained at 60° C. and 60RH % for 60 hours to allow the sample to absorb moisture, and thus a sample for testing the moisture/reflow sensitivity was produced. The sample after moisture absorption was placed on a heater, and subjected to heat treatment at 260° C. for 30 seconds three times. The sample was observed for its state during and after the measurement. The case that no crack or swelling was generated was rated as ◯, and the case that a crack or swelling was generated was rated as X.

<Moisture Absorption Test for Cured Product for Reflector>

A cured product for a reflector having a thickness of 1 mm was dried at 150° C. for 2 hours, and then left to stand under conditions of a temperature of 23° C. and a humidity of 50RH % for 1 hour. The weight of the cured product after the standing is denoted as W0. Thereafter, the cured product was left to stand at a temperature of 85° C. and a humidity of 85RH % for 7 days, and the weight of the cured product after the standing is denoted as W1. The moisture absorption rate was calculated by using the following equation.

$$\text{moisture absorption rate} = \frac{W1 - W0}{W0 \times 100}$$

<Thermal Yellowing Resistance Measurement for Cured Product for Reflector>

A cured product for a reflector having a thickness of 1 mm was left to stand at 150° C. for 7 days. The ΔYI value between before and after the standing was measured by using a spectrocolorimeter (SM-T45, manufactured by Suga Test Instruments Co., Ltd.), and the ΔYI change rate was determined.

<Moisture/Reflow Sensitivity Test for Optical Semiconductor Device Using Cured Product for Reflector as Reflector>

On each of optical semiconductor devices using reflectors obtained in respective Examples and Comparative Examples, a sealing material (HL 2002, manufactured by Inabata & Co., Ltd.) was potted and cured under conditions of 115° C. for 2 hours and 150° C. for 4 hours to produce a sample. The sample obtained was left to stand in a thermo-hygrostatic oven maintained at 60° C. and 60RH % for 60 hours to allow the sample to absorb moisture, and the sample after moisture absorption was placed on a heater, and subjected to heat treatment at 260° C. for 30 seconds three times. The sample was observed for its state during and after the measurement. The case that no crack or swelling was generated was rated as ◯, and the case that a crack or swelling was generated was rated as X.

Synthesis Example 1

The inside of a four-necked flask (reactor) provided with a stirrer, a thermometer, and condenser tube was purged with nitrogen, and the reactor was charged with 500 g of HDI and 0.1 g of isobutanol. When the internal temperature of the reactor under stirring reached 70° C., 0.03 g of N,N,N-trimethyl-N-benzylammonium hydroxide as a urethanization, allophanatization, and isocyanuratization catalyst was added into the reactor. At a timing when the refractive index of the reaction solution changed by 0.010, 0.04 g of an 85% aqueous solution of phosphoric acid was added to terminate the reaction. The reaction solution was retained at 90° C. for 1 hour to completely deactivate the catalyst.

After the reaction solution was filtrated, unreacted HDI was removed from the filtrate by using a falling type thin film distillation apparatus to obtain a polyisocyanate composition.

The polyisocyanate composition obtained was a transparent liquid, and the yield, the viscosity, the NCO group content, and the number average functionality were 120 g, 1500 mPa·s, 23.2% by mass, and 3.3, respectively. The percentage yield was 24%. The polyisocyanate composition obtained was subjected to NMR measurement, and the molar ratio of the isocyanurate group to the allophanate group (isocyanurate group/allophanate group) was found to be 99/1. The polyisocyanate composition obtained is referred to as M-1.

Synthesis Example 2

The same reactor as in Synthesis Example 1 was charged with 600 g of HDI and 10 g of isobutanol, and the mixture was allowed to undergo urethanization for 1 hour with the internal temperature of the reactor under stirring set to 90° C. Thereafter, 0.01 g of tetramethylammonium capriate as an isocyanuratization catalyst was added. At a timing when the refractive index of the reaction solution changed by 0.010, 0.03 g of an 85% aqueous solution of phosphoric acid was added to terminate the reaction. The reaction solution was retained at 100° C. for 1 hour to completely deactivate the catalyst.

After the reaction solution was filtered, unreacted HDI was removed by using a falling type thin film distillation apparatus to obtain a polyisocyanate composition.

The polyisocyanate composition obtained was a transparent liquid, and the yield, the viscosity, the NCO group content, and the number average functionality were 180 g, 700 mPa·s, 21.2% by mass, and 2.8, respectively. The polyisocyanate composition obtained was subjected to NMR measurement, and the molar ratio of the isocyanurate group to the allophanate group (isocyanurate group/allophanate group) was found to be 70/30. The polyisocyanate composition obtained is referred to as M-2.

Synthesis Example 3

The same reactor as in Synthesis Example 1 was charged with 600 g of HDI and 20 g of 3,3,5-trimethyl-1-hexanol. When the internal temperature of the reactor under stirring reached 90° C., 0.01 g of N,N,N-trimethyl-N-benzylammonium hydroxide was added into the reactor to perform urethanization reaction, allophanatization reaction, and isocyanuratization reaction. At a timing when the refractive index of the reaction solution changed by 0.007, 0.05 g of an 85% aqueous solution of phosphoric acid was added to terminate the reaction. The reaction solution was retained at 90° C. for 1 hour to completely deactivate the catalyst.

After the reaction solution was filtered, unreacted HDI was removed from the filtrate by using a falling type thin film distillation apparatus to obtain a polyisocyanate composition.

The polyisocyanate composition obtained was a transparent liquid, and the yield, the viscosity, the NCO group content, and the number average functionality were 120 g, 500 mPa·s, 20.0% by mass, and 2.5, respectively. The percentage yield was 20%. The polyisocyanate composition obtained was subjected to NMR measurement, and the molar ratio of the isocyanurate group to the allophanate group (isocyanurate group/allophanate group) was found to be 50/50. The polyisocyanate composition obtained is referred to as M-3.

Synthesis Example 4

The same reactor as in Synthesis Example 1 was charged with 500 g of HDI and 2 g of 2-ethyl-1-hexanol. The internal temperature of the reactor under stirring was elevated, and when 70° C. was reached, 0.05 g of tetramethylammonium capriate as an isocyanuratization catalyst was added into the reactor to perform urethanization reaction, allophanatization reaction, and isocyanuratization reaction. At a timing when the refractive index of the reaction solution changed by 0.02, 0.08 g of an 85% aqueous solution of phosphoric acid was added to terminate the reaction. Thereafter, the reaction solution was retained at 90° C. for 1 hour to completely deactivate the catalyst.

After the reaction solution was filtrated, unreacted HDI was removed from the filtrate by using a falling type thin film distillation apparatus to obtain a polyisocyanate composition.

The polyisocyanate composition obtained was a transparent liquid, and the yield, the viscosity, the NCO group content, and the number average functionality were 200 g, 3000 mPa·s, 21.5% by mass, and 3.4, respectively. The percentage yield was 40%. The polyisocyanate composition obtained was subjected to NMR measurement, and the molar ratio of the isocyanurate group to the allophanate group (isocyanurate group/allophanate group) was found to be 95/5. The polyisocyanate composition obtained is referred to as M-4.

Synthesis Example 5

The same reactor as in Synthesis Example 1 was charged with 600 g of HDI and 70 g of 2-ethyl-1-hexanol, and retained for 10 minutes with the internal temperature of the reactor under stirring set to 80° C. Thereafter, 0.01 g of tetramethylammonium capriate was added into the reactor to perform urethanization reaction, allophanatization reaction, and isocyanuratization reaction. At a timing when the refractive index of the reaction solution changed by 0.014, 0.02 g of an 85% aqueous solution of phosphoric acid was added to terminate the reaction. The reaction solution was retained at 80° C. for 1 hour to completely deactivate the catalyst.

After the reaction solution was filtered, unreacted HDI was removed from the filtrate by using a falling type thin film distillation apparatus to obtain a polyisocyanate composition.

The polyisocyanate composition obtained was a transparent liquid, and the yield, the viscosity, the NCO group content, and the number average functionality were 330 g, 350 mPa·s, 17.5% by mass, and 2.3, respectively. The percentage yield was 50%. The polyisocyanate composition obtained was subjected to NMR measurement, and the molar ratio of isocyanurate group/allophanate group was found to be 30/70. The polyisocyanate composition obtained is referred to as M-5.

Synthesis Example 6

The same reactor as in Synthesis Example 1 was charged with 500 g of HDI and 25 g of isopropanol, and the mixture was retained for 10 minutes with the internal temperature of the reactor under stirring set to 80° C. Thereafter, 0.01 g of tetrabutylammonium capriate was added into the reactor to perform urethanization reaction, allophanatization reaction, and isocyanuratization reaction. At a timing when the refractive index of the reaction solution changed by 0.015, 0.02 g of an 85% aqueous solution of phosphoric acid was added to terminate the reaction. The reaction solution was retained at 80° C. for 1 hour to completely deactivate the catalyst.

After the reaction solution was filtrated, unreacted HDI was removed by using a falling type thin film distillation apparatus to obtain a polyisocyanate composition.

The polyisocyanate composition obtained was a transparent liquid, and the yield, the viscosity, the NCO content, and the number average functionality were 260 g, 450 mPa·s, 19.0% by mass, and 2.4, respectively. The percentage yield was 50%. The polyisocyanate composition obtained was subjected to NMR measurement, and the molar ratio of isocyanurate group/allophanate group was found to be 40/60. The polyisocyanate composition obtained is referred to as M-6.

Synthesis Example 7

The same reactor as in Synthesis Example 1 was charged with 1000 g of HDI and 80 g of hexanol, and the mixture was retained for 1 hour with the internal temperature of the reactor under stirring set to 90° C. Thereafter, the internal temperature of the reactor was elevated to 130° C., and 0.1 g of zirconium 2-ethylhexanoate was added to perform urethanization reaction, allophanatization reaction, and isocyanuratization reaction. At a timing when the refractive index of the reaction solution changed by 0.005, 4.6 g of a 10% 2-ethyl-1-hexanol solution of pyrophosphoric acid was added to terminate the reaction. The reaction solution was retained at 130° C. for 1 hour to completely deactivate the catalyst.

After the reaction solution was filtrated, unreacted HDI was removed from the filtrate by using a falling type thin film distillation apparatus to obtain a polyisocyanate composition.

The polyisocyanate composition obtained was a transparent liquid, and the yield, the viscosity, the NCO group content, and the number average functionality were 270 g, 120 mPa·s, 18.0% by mass, and 2.0, respectively. The percentage yield was 25%. The polyisocyanate composition obtained was subjected to NMR measurement, and the molar ratio of isocyanurate group/allophanate group was found to be 3/97. The polyisocyanate composition obtained is referred to as M-7.

Synthesis Example 8

The same reactor as in Synthesis Example 1 was charged with 500 g of HDI and 70 g of tridecanol, and the mixture was retained for 10 minutes with the internal temperature of the reactor under stirring set to 80° C. Thereafter, 0.01 g of N,N,N-trimethyl-N-benzylammonium hydroxide was added into the reactor to perform urethanization reaction, allophanatization reaction, and isocyanuratization reaction. At a timing when the refractive index of the reaction solution changed by 0.016, 0.02 g of an 85% aqueous solution of phosphoric acid was added to terminate the reaction. The reaction solution was retained at 80° C. for 1 hour to completely deactivate the catalyst.

After the reaction solution was filtrated, unreacted HDI was removed from the filtrate by using a falling type thin film distillation apparatus to obtain a polyisocyanate composition.

The polyisocyanate composition obtained was a transparent liquid, and the yield, the viscosity, the NCO group content, and the number average functionality were 310 g, 600 mPa·s, 17.0% by mass, and 2.5, respectively. The percentage yield was 55%. The polyisocyanate composition obtained was subjected to NMR measurement, and the molar ratio of isocyanurate group/allophanate group was found to be 50/50. The polyisocyanate composition obtained is referred to as M-8.

Synthesis Example 9

Ninety parts by mass of M-4 and 10 parts by mass of IPDI were mixed together to obtain a polyisocyanate composition. The polyisocyanate composition obtained was a transparent liquid, and the viscosity, the NCO group content, and the number average functionality were 1400 mPa·s, 26.4% by mass, and 3.2, respectively. The polyisocyanate composition obtained was subjected to NMR measurement, and the molar ratio of isocyanurate group/allophanate group was found to be 95/5. The polyisocyanate composition obtained is referred to as M-9.

Synthesis Example 10

Ninety parts by mass of M-4 and 10 parts by mass of VESTANAT T1890 (trade name, manufactured by Evonik Industries AG, an isocyanurate-based form of IPDI) were mixed together to obtain a polyisocyanate composition. The polyisocyanate composition obtained was a transparent liquid, and the viscosity, the NCO group content, and the number average functionality were 5000 mPa·s, 21.2% by mass, and 3.3, respectively. The polyisocyanate composition obtained was subjected to NMR measurement, and the molar ratio of isocyanurate group/allophanate group was found to be 96/4. The polyisocyanate composition obtained is referred to as M-10.

Synthesis Example 11

Twenty parts by mass of M-1 and 80 parts by mass of M-7 were mixed together to obtain a polyisocyanate composition. The polyisocyanate composition obtained was a transparent liquid, and the viscosity, the NCO group content, and the number average functionality were 200 mPa·s, 21.0% by mass, and 3.0, respectively. The polyisocyanate composition obtained was subjected to NMR measurement, and the molar ratio of the isocyanurate group to the allophanate group (isocyanurate group/allophanate group) was found to be 20/80. The polyisocyanate composition obtained is referred to as M-11.

Synthesis Example 12

The same reactor as in Synthesis Example 1 was charged with 500 g of HDI, and 0.02 g of tetramethylammonium capriate as an isocyanuratization catalyst was added to perform allophanatization reaction and isocyanuratization reaction. At a timing when the refractive index of the reaction solution changed by 0.011, 0.06 g of an 85% aqueous solution of phosphoric acid was added to terminate the reaction. The reaction solution was retained at 100° C. for 1 hour to completely deactivate the catalyst.

After the reaction solution was filtrated, unreacted HDI was removed from the filtrate by using a falling type thin film distillation apparatus to obtain a polyisocyanate composition.

The polyisocyanate composition obtained was a transparent liquid, and the yield, the viscosity, the NCO group content, and the number average functionality were 130 g, 1600 mPa·s, 23.4% by mass, and 3.4, respectively. The polyisocyanate composition obtained was subjected to NMR measurement, and the molar ratio of the isocyanurate group to the allophanate group (isocyanurate group/allophanate group) was found to be 100/0. The polyisocyanate composition obtained is referred to as M-12.

Example 1

Twenty grams of M-2 as a polyisocyanate composition and 2000 ppm of N,N,N-trimethyl-N-benzylammonium hydroxide as an isocyanuratization catalyst based on the solid content of the polyisocyanate composition was blended, and the resultant was left to stand in vacuum for 5 minutes by using a vacuum stirring/defoaming mixer (V-mini 300, manufactured by EME CORPORATION), and then stirred for 5 minutes at 1500 rpm while the vacuum was retained to obtain a reaction solution. The reaction solution obtained was poured into a petri dish, and left to stand at 150° C. for 1 hour to obtain a polyisocyanate cured product K-1 having a thickness of 1 mm. The ratio of the isocyanurate group/the allophanate group and YI of K-1 were 80/20 and 8, respectively. The YI after a thermal yellowing resistance test was 15 and the YI value change was 7. Td1 and Td5 were 288° C. and 355° C., respectively.

Examples 2 to 25 and Comparative Examples 1 to 4

Polyisocyanate cured products K-2 to K-20 and L-1 to L-9 were obtained by using the same method as in Example 1 except that starting materials and reaction conditions were set as shown in Tables 1 and 2. The measurement results for the polyisocyanate cured products K-2 to K-20 and L-1 to L-9 obtained are shown in Tables 1 and 2.

Comparative Example 5

A two-liquid type polyurethane coating composition was produced as in the following.

An acrylic polyol (tradename "SETALUX 1767", manufactured by Nuplex Industries Ltd., resin component concentration: 65%, hydroxyl value: 150 mg/g resin) as a main agent of a polyol composition and the polyisocyanate composition M-4 as a curing agent were used and adjusted so that the molar ratio of isocyanate group/hydroxy group became 1/1. For a solvent, a urethane thinner (a mixture having a mass ratio of toluene (manufactured by Wako Pure Chemical Industries, Ltd.): butyl acetate (manufactured by Wako Pure Chemical Industries, Ltd.) ethyl acetate (manufactured by Wako Pure Chemical Industries, Ltd.): xylene (manufactured by Wako Pure Chemical Industries, Ltd.): propylene glycol methyl ether AC (manufactured by Godo Solvent K.K.)=30:30:20:15:5) was used and adjusted so that the solid content became 50% by mass. The resultant was dried at 23° C. for 7 days to completely cure. Thereafter, the solvent was completely removed by vacuum-drying at 80° C. for 24 hours to obtain a polyurethane sample L-10 having a thickness of 1 mm. The measurement results for the sample obtained are shown in Table 2.

TABLE 1

| | Polyisocyanate cured product | Polyisocyanate composition | | Solvent | | Antioxidant | | Catalyst | | Reaction conditions | | |
|---|---|---|---|---|---|---|---|---|---|---|---|---|
| | | Type | Amount | Type | Amount | | Amount | Type | Amount | Temperature | Time | Disappearance rate |
| Example 1 | K-1 | M-2 | 20 g | — | — | — | — | catalyst A | 2000 ppm | 150° C. | 1 h | 91% |
| Example 2 | K-2 | M-5 | 20 g | — | — | — | — | catalyst B | 3000 ppm | 150° C. | 1 h | 94% |
| Example 3 | K-3 | M-3 | 20 g | — | — | — | — | catalyst B | 3000 ppm | 150° C. | 1 h | 95% |
| Example 4 | K-4 | M-4 | 20 g | — | — | — | — | catalyst C | 2000 ppm | 150° C. | 1 h | 92% |
| Example 5 | K-5 | M-1 | 20 g | — | — | antioxidant A | 1000 ppm | catalyst A | 2000 ppm | 150° C. | 3 h | 90% |
| Example 6 | K-6 | M-4 | 20 g | — | — | antioxidant B | 2000 ppm | catalyst B | 7000 ppm | 120° C. | 1 h | 98% |
| Example 7 | K-7 | M-6 | 20 g | — | — | antioxidant E | 2000 ppm | catalyst B | 2000 ppm | 150° C. | 1 h | 92% |
| Example 8 | K-8 | M-8 | 20 g | — | — | antioxidant A | 2000 ppm | catalyst B | 2000 ppm | 150° C. | 1 h | 92% |
| Example 9 | K-9 | M-9 | 20 g | — | — | — | — | catalyst B | 4000 ppm | 150° C. | 3 h | 96% |
| Example 10 | K-10 | M-10 | 20 g | — | — | antioxidant A antioxidant E | 2000 ppm 1000 ppm | catalyst C | 4000 ppm | 150° C. | 3 h | 95% |
| Example 11 | K-11 | M-4 | 20 g | — | — | antioxidant A | 2000 ppm | catalyst C | 2000 ppm | 150° C. | 1 h | 92% |
| Example 12 | K-12 | M-5 | 20 g | — | — | antioxidant A | 2000 ppm | catalyst C | 2000 ppm | 150° C. | 1 h | 91% |
| Example 13 | K-13 | M-4 | 20 g | — | — | antioxidant E | 2000 ppm | catalyst C | 2000 ppm | 150° C. | 1 h | 93% |
| Example 14 | K-14 | M-2 | 20 g | — | — | antioxidant E | 2000 ppm | catalyst C | 2000 ppm | 150° C. | 1 h | 91% |
| Example 15 | K-15 | M-4 | 20 g | — | — | antioxidant C | 2000 ppm | catalyst A | 2000 ppm | 150° C. | 1 h | 92% |
| Example 16 | K-16 | M-3 | 20 g | — | — | antioxidant B | 2000 ppm | catalyst B | 2000 ppm | 150° C. | 1 h | 95% |
| Example 17 | K-17 | M-2 | 20 g | — | — | antioxidant D | 2000 ppm | catalyst B | 2000 ppm | 150° C. | 1 h | 92% |
| Example 18 | K-18 | M-4 | 20 g | — | — | antioxidant A antioxidant E | 2000 ppm 1000 ppm | catalyst C | 2000 ppm | 150° C. | 1 h | 93% |
| Example 19 | L-19 | M-11 | 20 g | — | — | antioxidant A antioxidant E | 2000 ppm 1000 ppm | catalyst C | 2000 ppm | 150° C. | 1 h | 92% |
| Example 20 | L-20 | M-7 | 20 g | — | — | antioxidant E | 3000 ppm | catalyst C | 2000 ppm | 150° C. | 1 h | 93% |
| Example 21 | L-1 | M-4 | 20 g | — | — | — | — | catalyst B | 1000 ppm | 120° C. | 1 h | 80% |
| Example 22 | L-2 | M-4 | 20 g | — | — | antioxidant A antioxidant E | 1000 ppm 1000 ppm | catalyst C | 1000 ppm | 120° C. | 1 h | 80% |
| Example 23 | L-3 | M-2 | 16 g | xylene | 4 g | — | — | catalyst A | 2000 ppm | 150° C. | 1 h | 92% |
| Example 24 | L-4 | M-4 | 16 g | xylene | 4 g | antioxidant A antioxidant E | 2000 ppm 1000 ppm | catalyst B | 2000 ppm | 150° C. | 1 h | 92% |
| Example 25 | L-5 | M-4 | 16 g | DMI | 4 g | antioxidant A antioxidant E | 1000 ppm 1000 ppm | catalyst C | 2000 ppm | 150° C. | 1 h | 90% |

TABLE 1-continued

| | | Isocyanurate/ allophanate | Isocyanurate/ (urethane + urea) | Yellowness index (YI) Initial value | After thermal yellowing resistance test | Δ | Thermogravimetric analysis Td1 | Td5 | Impact resistance | Water vapor permeability g/m2 | Moisture/ reflow sensitivity |
|---|---|---|---|---|---|---|---|---|---|---|---|
| | Example 1 | 80/20 | 100/0 | 8 | 15 | 7 | 288° C. | 355° C. | 40 cm | 23 | o |
| | Example 2 | 60/40 | 100/0 | 9 | 17 | 8 | 255° C. | 310° C. | 45 cm | 25 | o |
| | Example 3 | 70/30 | 100/0 | 8 | 16 | 8 | 270° C. | 330° C. | 40 cm | 23 | o |
| | Example 4 | 98/2 | 100/0 | 7 | 13 | 6 | 306° C. | 379° C. | 25 cm | 10 | o |
| | Example 5 | 99/1 | 100/0 | 9 | 19 | 10 | 300° C. | 370° C. | 15 cm | 10 | o |
| | Example 6 | 98/2 | 100/0 | 10 | 20 | 10 | 306° C. | 379° C. | 10 cm | 10 | o |
| | Example 7 | 62/38 | 100/0 | 9 | 18 | 9 | 250° C. | 310° C. | 45 cm | 20 | o |
| | Example 8 | 68/32 | 100/0 | 9 | 18 | 9 | 245° C. | 305° C. | 40 cm | 32 | o |
| | Example 9 | 97/3 | 100/0 | 6 | 11 | 5 | 320° C. | 380° C. | 25 cm | 12 | o |
| | Example 10 | 98/2 | 100/0 | 7 | 10 | 3 | 340° C. | 400° C. | 25 cm | 12 | o |
| | Example 11 | 98/2 | 100/0 | 7 | 9 | 2 | 295° C. | 375° C. | 25 cm | 13 | o |
| | Example 12 | 60/40 | 100/0 | 8 | 11 | 3 | 255° C. | 310° C. | 45 cm | 20 | o |
| | Example 13 | 98/2 | 100/0 | 6 | 7 | 1 | 295° C. | 375° C. | 25 cm | 10 | o |
| | Example 14 | 80/20 | 100/0 | 8 | 10 | 2 | 288° C. | 355° C. | 40 cm | 15 | o |
| | Example 15 | 98/2 | 100/0 | 7 | 12 | 5 | 295° C. | 375° C. | 25 cm | 11 | o |
| | Example 16 | 70/30 | 100/0 | 8 | 14 | 6 | 270° C. | 330° C. | 40 cm | 16 | o |
| | Example 17 | 80/20 | 100/0 | 8 | 13 | 5 | 288° C. | 355° C. | 40 cm | 15 | o |
| | Example 18 | 98/2 | 100/0 | 7 | 8 | 1 | 293° C. | 372° C. | 25 cm | 10 | o |
| | Example 19 | 45/55 | 100/0 | 9 | 19 | 10 | 240° C. | 305° C. | 50 cm | 27 | o |
| | Example 20 | 20/80 | 100/0 | 10 | 20 | 10 | 210° C. | 270° C. | 50 cm | 30 | o |
| | Example 21 | 96/4 | 98/2 | 7 | 30 | 23 | 270° C. | 325° C. | 30 cm | 28 | o |
| | Example 22 | 96/4 | 98/2 | 9 | 27 | 18 | 270° C. | 325° C. | 30 cm | 29 | o |
| | Example 23 | 80/20 | 100/0 | 15 | — | — | 265° C. | 320° C. | 30 cm | 18 | o |
| | Example 24 | 98/2 | 100/0 | 15 | — | — | 275° C. | 335° C. | 25 cm | 15 | o |
| | Example 25 | 98/2 | 100/0 | 14 | — | — | 275° C. | 330° C. | 25 cm | 16 | o | catalyst A: N,N,N-trimethyl-N-benzylammonium hydroxide
catalyst B: tetrabutylammonium capriate
catalyst C: tetramethylammonium capriate
catalyst D: sodium p-toluenesulfinate
antioxidant A: BHT (hindered phenol-based compound)
antioxidant B: Irganox 565 (tradename, manufactured by BASF Japan Ltd., sulfur-containing compound)
antioxidant C: ADK STAB C (tradename, manufactured by ADEKA CORPORATION, phosphorus-containing compound)
antioxidant D: Tinuvin 765 (tradename, manufactured by BASF Japan Ltd., hindered amine-based compound)
antioxidant E: Sumilizer GP (tradename, manufactured by Sumitomo Chemical Co., Ltd., phosphorus-containing/hindered phenol-based compound)
DMI: 1,3-dimethyl-2-imidazolidinone

TABLE 2

| | Polyisocy- anate cured product | Polyisocyanate composition Type | Amount | Solvent Type | Amount | Antioxidant Amount | Catalyst Type | Amount | Reaction conditions Temper- ature | Time | Disappear- ance rate |
|---|---|---|---|---|---|---|---|---|---|---|---|
| Comparative Example 1 | L-6 | M-4 | 10 g | DMI | 10 g | — | catalyst D | 10000 ppm | 150° C. | 2 h | no film formed |
| Comparative Example 2 | L-7 | HDI | 10 g | DMI | 10 g | — | catalyst C | 5000 ppm | 150° C. | 3 h | 60% |
| Comparative Example 3 | L-8 | HDI | 10 g | DMI | 10 g | — | catalyst D | 23000 ppm | 150° C. | 2 h | 100% |
| Comparative Example 4 | L-9 | M-12 | 20 g | — | — | — | catalyst B | 2000 ppm | 150° C. | 1 h | 92% |
| Comparative Example 5 | L-10 | two-liquid type polyurethane coating composition | | — | — | — | | | 23° C. | 168 h | 96% |

| | | Isocyanurate/ allophanate | Isocyanurate/ (urethane + urea) | Yellowness index (YI) Initial value | After thermal yellowing resistance test | Δ | Thermogravimetric analysis Td1 | Td5 | Impact resistance | Water vapor permeability g/m2 | Moisture/ reflow sensitivity |
|---|---|---|---|---|---|---|---|---|---|---|---|
| | Comparative Example 1 | no film formed | | | | | — | — | — | — | — |

TABLE 2-continued

| | | | | | | | | | | |
|---|---|---|---|---|---|---|---|---|---|---|
| Comparative Example 2 | 100/0 | 96/4 | 30 | — | — | — | — | — | — | x swelling |
| Comparative Example 3 | 100/0 | 100/0 | 35 | — | — | — | — | — | — | x cracking |
| Comparative Example 4 | 100/0 | 100/0 | 7 | 14 | 7 | 296° C. | 378° C. | 10 cm | 10 | x swelling |
| Comparative Example 5 | — | 80/20 | 6 | 50 | 44 | 207° C. | 210° C. | — | 105 | — | catalyst A: N,N,N-trimethyl-N-benzylammonium hydroxide
catalyst B: tetrabutylammonium capriate
catalyst C: tetramethylammonium capriate
catalyst D: sodium p-toluenesulfinate
antioxidant A: BHT (hindered phenol type)
antioxidant B: Irganox 565 (tradename, manufactured by BASF Japan Ltd., sulfur-containing compound)
antioxidant C: ADK STAB C (tradename, manufactured by ADEKA CORPORATION, phosphorus-containing compound)
antioxidant D: Tinuvin 765 (tradename, manufactured by BASF Japan Ltd., hindered amine-based compound)
antioxidant E: Sumilizer GP (tradename, manufactured by Sumitomo Chemical Co., Ltd., phosphorus-containing/hindered phenol-based compound)
DMI: 1,3-dimethyl-2-imidazolidinone Example 26

One hundred parts of the polyisocyanate composition M-4, 0.2 parts of BHT, 0.2 parts of Sumilizer GP, 0.2 parts of tetramethylammonium capriate, 400 parts of the spheroidal silica MSR-4500TN (manufactured by Tatsumori Ltd.), 300 parts of zinc oxide #1 (manufactured by Sakai Chemical Industry Co., Ltd.), and 1 part of calcium stearate (manufactured by Taihei Chemical Industrial Co., Ltd.) were blended, and the resultant was left to stand in vacuum for 5 minutes by using a vacuum stirring/defoaming mixer (V-mini 300, manufactured by EME CORPORATION), and then stirred for 5 minutes at 1500 rpm while the vacuum was retained to obtain a reaction solution for a reflector. The reaction solution obtained was transfer-molded to obtain a cured product for a reflector having a thickness of 1 mm. The cured product obtained is referred to as R-1. The ratio of isocyanurate/allophanate group of R-1 was 98/2. The molding was carried out under conditions of a temperature of 170° C., a time of 10 minutes, and a molding pressure of 8 to 14 MPa. Further, the above reaction solution for a reflector was transfer-molded to produce a reflector, and an optical semiconductor device was produced with the reflector. The optical semiconductor device obtained is referred to as H-1.

The measurement results for the cured product for a reflector R-1 obtained and the optical semiconductor device H-1 using the cured product for a reflector as the reflector are shown in Table 3.

Comparative Example 6

One hundred parts of Genestar TE112 (manufactured by KURARAY CO., LTD.: polyamide resin), 400 parts of the spheroidal silica MSR-4500TN (manufactured by Tatsumori Ltd.), 300 parts of zinc oxide #1 (manufactured by Sakai Chemical Industry Co., Ltd.), and 1 part of calcium stearate (manufactured by Taihei Chemical Industrial Co., Ltd.) were blended, and melt-kneaded at a resin temperature of 320° C. with the twin-screw extruder TEM-18SS (manufactured by TOSHIBA MACHINE CO., LTD.). A pellet obtained through the melt-kneading was dried with a hot air dryer at 120° C. for 3 hours. Subsequently, the pellet obtained was molded with an injection molding machine at a resin temperature of 330° C. and a mold temperature of 140° C. to obtain a cured product for a reflector having a thickness of 1 mm. The cured product for a reflector obtained is referred to as R-2. A reflector was produced by using an injection molding machine under the same conditions, and an optical semiconductor device was produced with the reflector. The optical semiconductor device obtained is referred to as H-2.

The measurement results for the cured product for a reflector R-2 obtained and the optical semiconductor device H-2 using the cured product for a reflector as the reflector are shown in Table 3.

TABLE 3

| | | Thermal yellowing resistance ΔYI change rate [%] | Hygroscopicity [%] | Moisture/reflow sensitivity |
|---|---|---|---|---|
| Example 26 | Sample | 3.0% | R-1 0.2% | H-1 ○ |
| Comparative Example 6 | Sample | 4.0% | R-2 1.2% | H-2 X |

The present application claims a priority based on the Japanese patent application (Japanese Patent Application No. 2014-095296) filed on May 2, 2014, and the content thereof is incorporated herein by reference.

INDUSTRIAL APPLICABILITY

The polyisocyanate cured product according to the present invention has the features of having very high thermal resistance and moisture/reflow sensitivity, and further having water vapor impermeability in combination.

Accordingly, the polyisocyanate cured product according to the present invention can be used as a starting material for a coating material, an adhesive, a casting material, a sealing material, a foam, or a plastic material. Especially, the polyisocyanate cured product according to the present invention is particularly suitable for a sealing material and reflector for an optical semiconductor device including an optical semiconductor element sealed therein.

The invention claimed is:

1. A method for producing a polyisocyanate cured product by using:
   (a) a polyisocyanate composition comprising: a polyisocyanate obtained from at least one diisocyanate selected from the group consisting of an aliphatic diisocyanate and an alicyclic diisocyanate and having an isocyanurate group; and a polyisocyanate obtained from at least one diisocyanate selected from the group consisting of an aliphatic diisocyanate and an alicyclic diisocyanate and having an allophanate group, and (b) an isocyanuratization catalyst as starting materials;

wherein the method comprises a step of performing isocyanuratization reaction under a substantially solvent-free condition until a disappearance rate of an isocyanate group (NCO group) in the polyisocyanate composition reaches 90% or higher, and wherein the polyisocyanate cured product has a molar ratio of isocyanurate group to allophanate group (isocyanurate group/allophanate group) of 99/1 to 97/3.

2. The method for producing the polyisocyanate cured product according to claim 1, wherein a molar ratio of the isocyanurate group to the allophanate group (isocyanurate group/allophanate group) in the polyisocyanates in the polyisocyanate composition starting materials is 99/1 to 95/5.

3. The method for producing the polyisocyanate cured product according to claim 2, wherein the polyisocyanate composition is a polyisocyanate composition obtained by using a monoalcohol having 3 to 9 carbon atoms as one of the starting materials.

4. The method for producing the polyisocyanate cured product according to claim 1, wherein an isocyanate group (NCO group) content of the polyisocyanates in the polyisocyanate composition is 7.0 to 23.0% by mass.

5. The method for producing the polyisocyanate cured product according to claim 1, wherein a number average functionality of the isocyanate group (NCO group) in the polyisocyanates in the polyisocyanate composition is 2.1 or more.

6. The method for producing the polyisocyanate cured product according to claim 1, wherein the (b) isocyanuratization catalyst comprises a quaternary organic ammonium salt.

7. The method for producing the polyisocyanate cured product according to claim 1, wherein an amount of the (b) isocyanuratization catalyst added is 5000 ppm or less based on a solid content of the polyisocyanate composition.

8. The method for producing the polyisocyanate cured product according to claim 1, wherein (c) an antioxidant is further used as a starting material.

9. The method for producing the polyisocyanate cured product according to claim 8, wherein the (c) antioxidant is at least one selected from the group consisting of a hindered phenol antioxidant, a hindered amine antioxidant, a sulfur-containing antioxidant, and a phosphorus-containing antioxidant.

* * * * *